United States Patent
Cheng et al.

(10) Patent No.: US 10,425,043 B1
(45) Date of Patent: Sep. 24, 2019

(54) OPERATIONAL AMPLIFIER WITH CONSTANT TRANSCONDUCTANCE BIAS CIRCUIT AND METHOD USING THE SAME

(71) Applicant: Novatek Microelectronics Corp., Hsinchu (TW)

(72) Inventors: Jhih-Siou Cheng, New Taipei (TW); Keko-Chun Liang, Hsinchu (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 15/970,872

(22) Filed: May 3, 2018

(51) Int. Cl.
   *H03F 1/30* (2006.01)
   *H03F 3/45* (2006.01)

(52) U.S. Cl.
   CPC ......... *H03F 1/301* (2013.01); *H03F 3/45269* (2013.01); *H03F 2200/18* (2013.01); *H03F 2203/45112* (2013.01)

(58) Field of Classification Search
   CPC ...................................................... H03F 1/301
   See application file for complete search history.

(56) References Cited

U.S. PATENT DOCUMENTS

| | | | | |
|---|---|---|---|---|
| 4,555,673 A * | 11/1985 | Huijsing | ............. | H03F 3/45085 330/252 |
| 5,311,145 A * | 5/1994 | Huijsing | ............... | H03F 3/3028 330/255 |
| 5,418,494 A * | 5/1995 | Betti | .................... | H03G 1/0023 330/254 |
| 6,359,511 B1 * | 3/2002 | Phanse | .................... | H03F 1/301 330/254 |
| 6,803,829 B2 * | 10/2004 | Duncan | ............... | H01F 17/0006 257/E27.046 |
| 9,178,503 B2 * | 11/2015 | Hsieh | .................... | H03F 3/4521 |
| 2005/0068105 A1 * | 3/2005 | Shimatani | ............. | H03F 3/4521 330/255 |
| 2007/0057723 A1 * | 3/2007 | Pan | ...................... | G11C 7/1078 330/252 |

* cited by examiner

*Primary Examiner* — Patricia T Nguyen
(74) *Attorney, Agent, or Firm* — JCIPRNET

(57) ABSTRACT

An operational amplifier with a constant transconductance bias circuit and a method thereof are introduced. The operational amplifier includes a differential difference amplifier and the constant transconductance bias circuit. The differential difference amplifier has at least one first differential transistor pair and at least one second differential transistor pair. The constant transconductance bias circuit is electrically connected to the differential difference amplifier, and configured to output a first bias voltage to bias the at least one first differential transistor pair and output a second bias voltage to bias the at least one second differential transistor pair. The first bias voltage and the second bias voltage are configured to maintain constant transconductance of the differential difference amplifier.

18 Claims, 6 Drawing Sheets

OPERATIONAL AMPLIFIER WITH CONSTANT TRANSCONDUCTANCE BIAS CIRCUIT AND METHOD USING THE SAME

BACKGROUND

Technical Field

The disclosure generally relates to an operational amplifier (OP) and a method thereof, and more particularly relates to an OP having a constant transconducance (constant Gm) bias circuit and a method thereof that are capable of remaining substantially constant Gm in the OP, thereby reducing interpolation errors of the OP.

Description of Related Art

Digital-to-analog converters (DACs) are an essential component for most of electronic devices, especially in a technical field of display. A DAC may include or connect with an OP for outputting an output signal using a number of input signals (or input voltages). Some of the input voltages may be obtained by performing an interpolation operation by an OP having constant current sources. However, the interpolation operations are influenced by variations of Gm values of transistor pairs inside the OP as a result of voltage and temperature (PVT) variation effect. As such, interpolation operations may generate erroneous interpolated voltages, thereby degrading the performance of the OP.

Therefore, it would be desirable to mitigate the errors of the interpolation operation, thereby improving performance of the OP.

Nothing herein should be construed as an admission of knowledge in the prior art of any portion of the present disclosure.

SUMMARY

An operational amplifier (OP) with a constant transconductance (Gm) bias circuit and a method thereof are introduced. The OP and the method thereof are capable of remaining substantially constant Gm in the OP, thereby reducing interpolation errors of the OP.

The OP includes a differential difference amplifier (DDA) and a constant Gm bias circuit. The DDA has at least one first differential transistor pair and at least one second differential transistor pair. The constant Gm bias circuit is electrically connected to the DDA, and configured to output a first bias voltage to bias the at least one first differential transistor pair and output a second bias voltage to bias the at least one second differential transistor pair. The first bias voltage and the second bias voltage are configured to maintain constant Gm of the DDA.

The method for biasing a DDA having at least one first differential transistor pair and at least one second differential transistor pair is also introduced. The method comprises steps of generating a first bias voltage and a second bias voltage and outputting the first bias voltage to bias the at least one first differential transistor pair and the second bias voltage to bias the at least one second differential transistor pair. The first bias voltage and the second bias voltage are configured to maintain constant Gm of the DDA.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure.

DESCRIPTION OF THE EMBODIMENTS

It is to be understood that other embodiments may be utilized and structural changes may be made without departing from the scope of the present disclosure. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted," and variations thereof herein are used broadly and encompass direct and indirect connections, couplings, and mountings.

Figure 1:
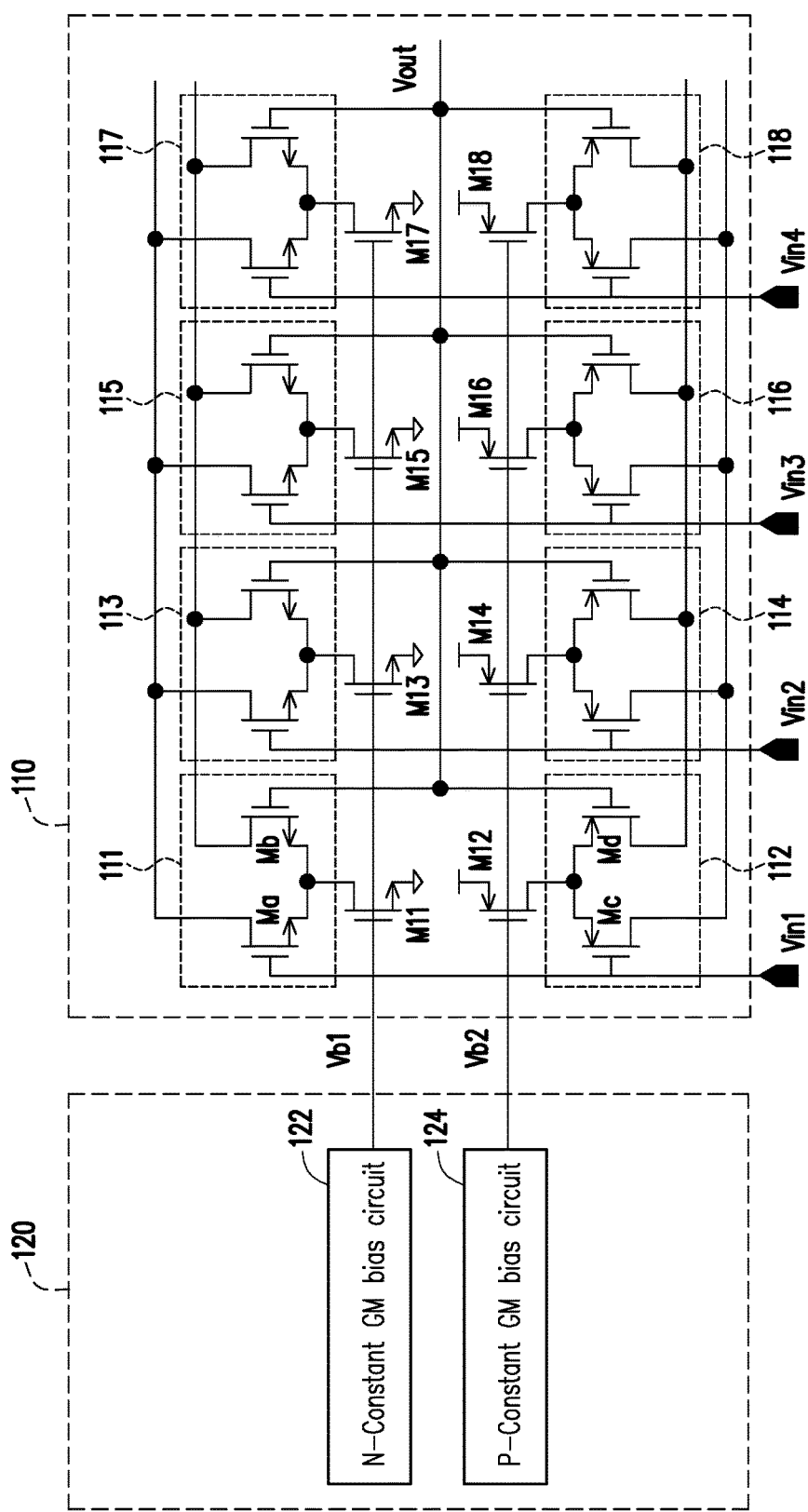
FIG. 1 illustrates a schematic diagram of an operational amplifier according to an embodiment of the present disclosure.

Referring to FIG. 1, an OP 100 may include a DDA 110 and a constant Gm bias circuit 120. The DDA 110 may include N-type differential transistor pairs 111 to 117 and P-type differential transistor pairs 112 to 116. Each of the N-type differential transistor pairs 111 to 117 is coupled to one of bias transistors M11 to M17; and each of the P-type differential transistor pairs 112 to 116 is coupled to one of bias transistors M12 to M18. For example, the N-type differential transistor pair 111 is coupled to the bias transistor M11, and P-type differential transistor pair 112 is coupled to the bias transistor M12. A bias voltage Vb1 is provided to the transistors M11 to M17 to bias the N-type differential transistor pairs 111 to 117; and a bias voltage Vb2 is provided to the transistors M12 to M18 to bias the P-type differential transistor pairs 112 to 118.

Each of the N-type differential transistor pairs 111 to 117 includes a transistor Ma and a transistor Mb which are N-type transistors. In other words, the transistors Ma and Mb have N-type conductivity. Each of the P-type differential transistor pairs 112 to 118 includes a transistor Mc and a transistor Md which are P-type transistors (or having P-type conductivity). For example, the transistors Ma and Mb may be N-type metal oxide semiconductor (NMOS) and the transistor Mc and Md may be P-type metal oxide semiconductor (PMOS), but the disclosure is not limited to any specific transistor.

The control terminals of the transistors Ma and Mc are electrically coupled to each other and are coupled to an input terminal of the DDA 110 to receive one of the input signals (or an input voltages) Vin1 to Vin 4. The control terminals of the transistors Mb and Md are electrically coupled to each other and is coupled to an output terminal of the DDA 110. In other words, each of the N-type differential transistor pairs 111 to 117 and each of the P-type differential transistor pairs 112 to 118 are coupled to one of the input terminals to receive one of the input signal Vin1 to Vin4. All of the N-type differential transistor pairs 111 to 118 and the P-type differential transistor pairs 112 to 117 are coupled to the output terminal of the DDA 110.

In FIG. 1, the DDA 110 has four input terminals to receive four input voltages Vin1 to Vin4 provided from outside of the DDA 110. However, a number of the input terminal of the DDA 110 is not limited thereto. A number of the input terminals of the DDA 110 may depend on a number of the N-type differential transistor pairs 111 to 117 and a number of P-type differential transistor pairs 112 to 118 of the DDA 110. In an embodiment of the present disclosure, some of the input terminals of DDA 110 may receive the same input signal among the input signal Vin1 to Vin4 so that the DDA 110 may performs an interpolation operation on the input signals to output different interpolated signals at the output terminal Vout of the DDA 110.

In an embodiment of the present disclosure, the bias voltages Vb1 and Vb2 are provided to the bias transistors M11 to M17 and M12 to M18 so that the Gm values of differential transistor pairs (N-type and P-type differential transistor pairs) of the DDA 110 remain substantially constant regardless of variations in temperature or voltage. In this way, the interpolation errors due to the influence of the PVT effect may be prevented.

The constant Gm bias circuit 120 are configured to generate and output the bias voltages Vb1 and Vb2 to the DDA 110. As aforementioned, the bias voltages Vb1 and Vb2 are configured to bias the differential transistor pairs of the DDA 110 in a way that the Gm value of the differential transistor pairs are substantially constant. As shown in FIG. 1, the constant Gm bias circuit 120 may include a N-constant Gm bias circuit 122 and a P-constant Gm bias constant circuit 124. The N-constant Gm bias circuit 122 is configured to generate and output the bias voltage Vb1 to the DDA 110. The P-constant Gm constant circuit 124 is configured to generate and output the bias voltage Vb2 to the DDA 110. Although FIG. 2 shows one N-constant Gm bias circuit 122 and one P-constant Gm constant circuit 124, the disclosure is not limited to any number and type of the constant Gm bias circuits.

Figure 2:
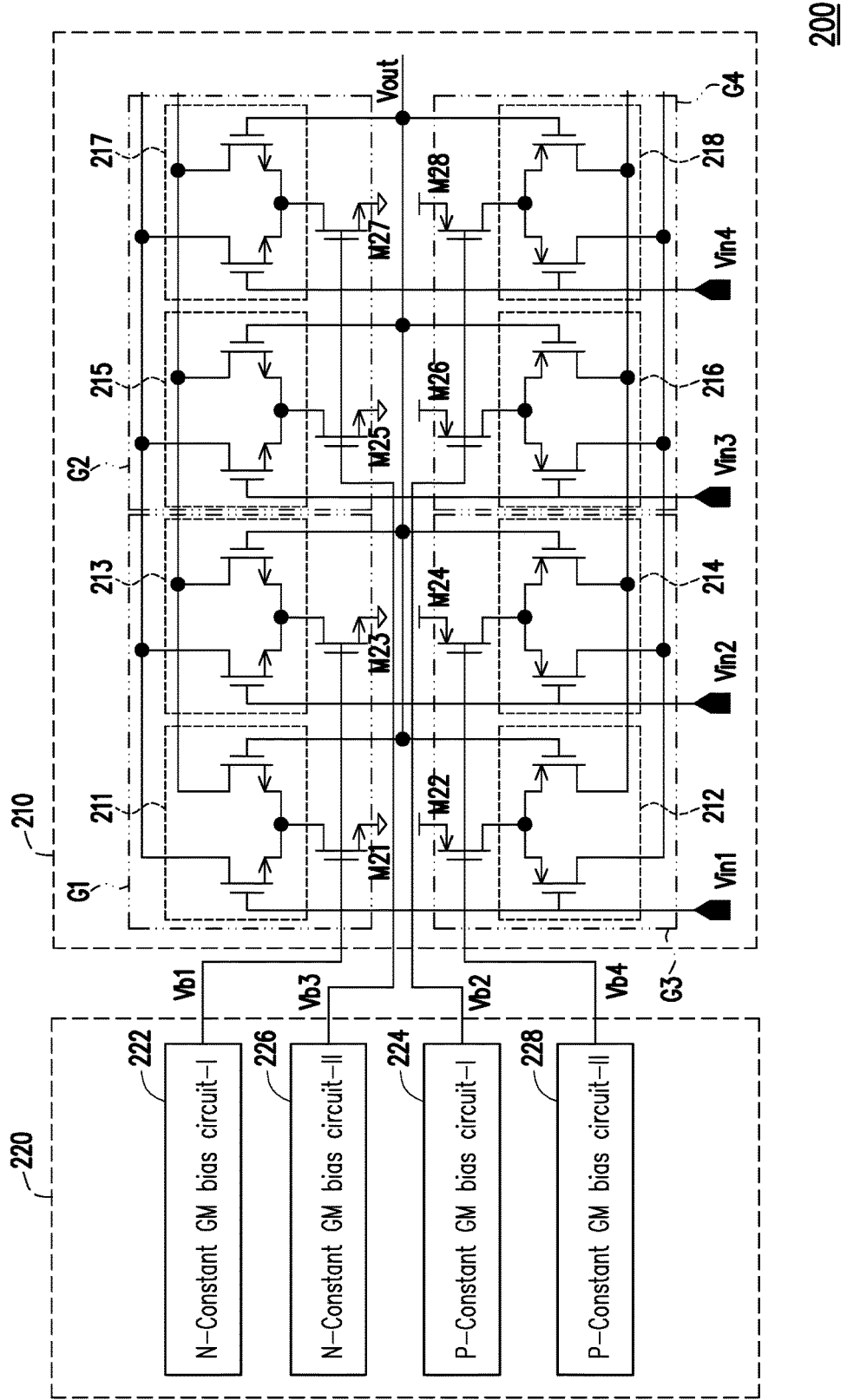
FIG. 2 illustrates a schematic diagram of an operational amplifier according to another embodiment of the present disclosure.

Referring to FIG. 2, an OP 200 which includes a DDA 210 and a constant Gm bias circuit 220 is introduced. The DDA 210 may include N-type differential transistor pairs 211 to 217 and P-type differential transistor pairs 212 to 218. The N-type differential transistor pairs 211 to 217 are divided into transistor pair groups G1 and G2, where the transistor pair group G1 includes the differential transistor pairs 211 and 213, and the transistor pair group G2 includes the differential transistor pairs 215 and 217. Similarly, the P-type differential transistor pairs 212 to 218 are divided into transistor pair groups G3 and G4, where the transistor pair group G3 includes the differential transistor pairs 212 and 214, and the transistor pair group G4 includes differential transistor pairs 216 and 218.

Each of transistor pair groups G1 to G4 is biased by the same bias voltage. Particularly, the bias voltage Vb1 is provided to transistors M21 and M23 of the transistor pair group G1 to bias the differential transistor pairs 211 and 213. The bias voltage Vb3 is provided to transistors M25 and M27 of the transistor pair group G2 to bias the differential transistor pairs 215 and 217. The bias voltage Vb2 is provided to transistors M26 and M28 of the transistor pair group G4 to bias the differential transistor pairs 216 and 218. The bias voltage Vb4 is provided to transistors M22 and M24 of the transistor pair group G3 to bias the differential transistor pairs 212 and 214.

The constant Gm bias circuit 220 may include two N-constant Gm bias circuits 222 and 226 and two P-constant Gm bias circuits 224 and 228. The N-constant Gm bias circuits 222 and 226 are configured to generate and output bias voltage Vb1 and Vb3 to the DDA 210, and the P-constant Gm bias circuits 224 and 228 are configured to generate and output bias voltage Vb2 and Vb4 to the DDA 210. The bias voltages Vb1 to Vb4 are configured to bias the differential transistor pairs of the DDA 210 in a way that the Gm value of the differential transistor pairs are substantially constant.

Figure 3:
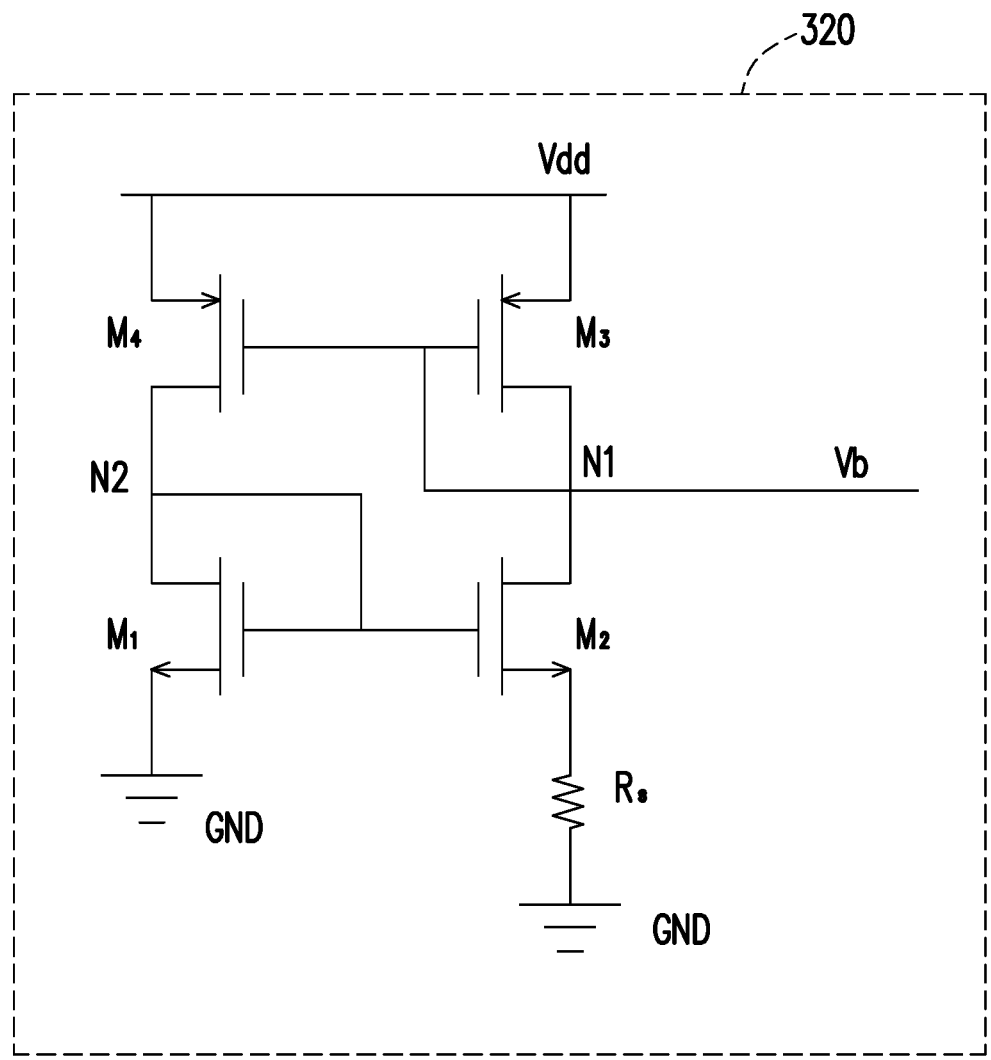
FIG. 3 illustrates a schematic diagram of constant Gm bias circuit according to another embodiment of the present disclosure.

FIG. 3 illustrates a circuit diagram of a constant Gm bias circuit 320 according to an embodiment of the disclosure. The constant Gm bias circuit 330 includes two transistor pairs connected to each other through two node N1 and N2. One of the transistor pairs includes transistors M1 and M2; and the other one of the transistor pairs includes transistors M3 and M4. The node N1 is coupled to the control terminals of the transistors M3 and M4; and the node N2 is coupled to the control terminals of the transistors M1 and M2. The bias voltage Vb is outputted from the node N1, and may be provided to the DDA 110 of the OP 100 in FIG. 1 or the DDA 210 of the OP 200 in FIG. 2. The bias voltage Vb generated by constant Gm bias circuit 320 may bias the differential transistor pair of in a way that the Gm value of the differential transistor pair remains substantially constant.

The constant Gm bias circuit 320 further includes a Gm setting resistor Rs which is coupled to the transistor M2. The resistance value of the resistor Rs is inversely proportional to the Gm value of the differential transistor pair, thus the resistance value of the resistor Rs may be selected according to the designed needs.

In an embodiment of the present disclosure, the transistors M1 and M2 may be NMOS transistors and the transistors M3 and M4 may be PMOS transistor, but the disclosure is not limited thereto.

Figure 4A:
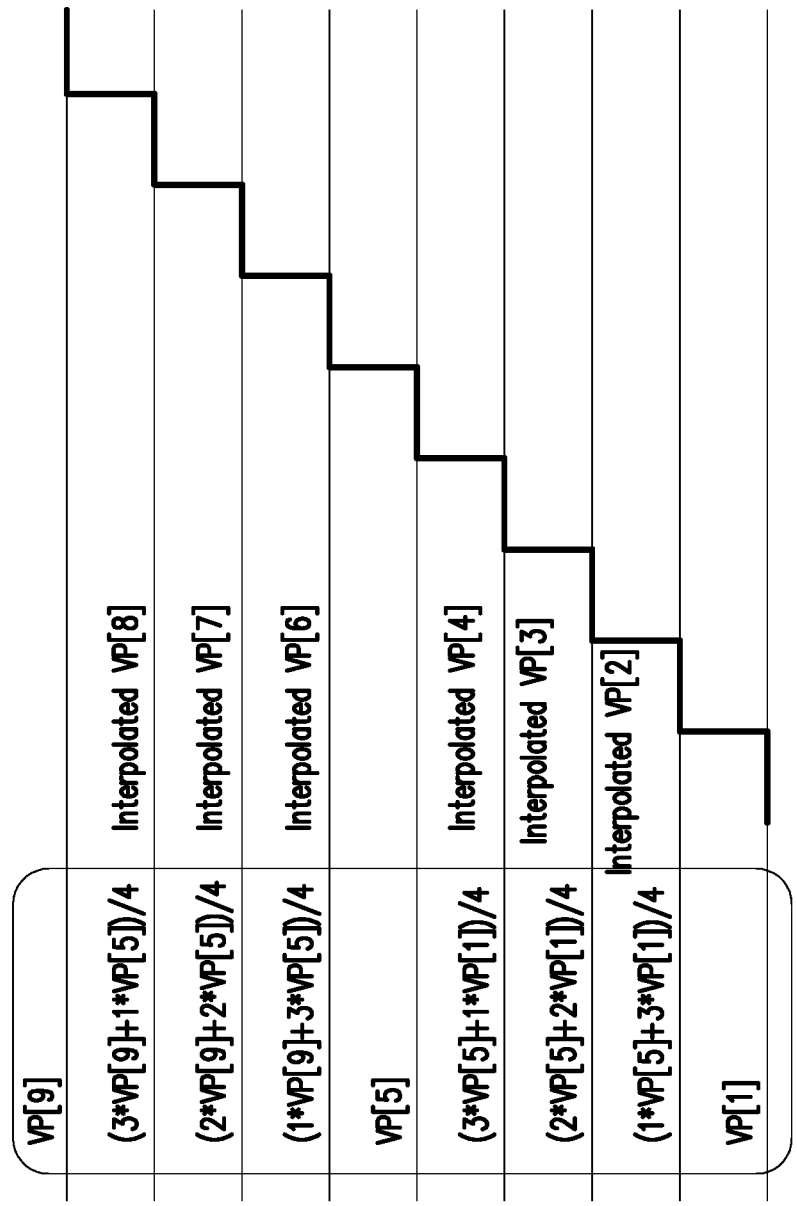
FIG. 4A illustrates an example of input voltages and interpolated voltages of an operational amplifier according to an embodiment of the present disclosure.

FIG. 4A illustrates input voltages and interpolated voltages of an OP according to an embodiment of the present disclosure. In FIG. 4A, nine input values VP[1] to VP[9] are shown, where the input voltage VP[1], VP[5] and VP[9] are predetermined voltages and the voltages VP[2] to VP[4] and VP[6] to VP[8] are interpolated voltages. The interpolated voltages VP[2] to VP[4] and VP[6] to VP[8] are obtained by performed interpolation operations based on the predetermined input voltage VP[1], VP[5] and VP[9]. For example, the interpolated voltage VP[8] is obtained according to the predetermined voltages VP[5] and VP[9] according to the formula (1):

$$VP[8]=(3*VP[9]+1*VP[5])/4 \quad (1)$$

Figure 4B:
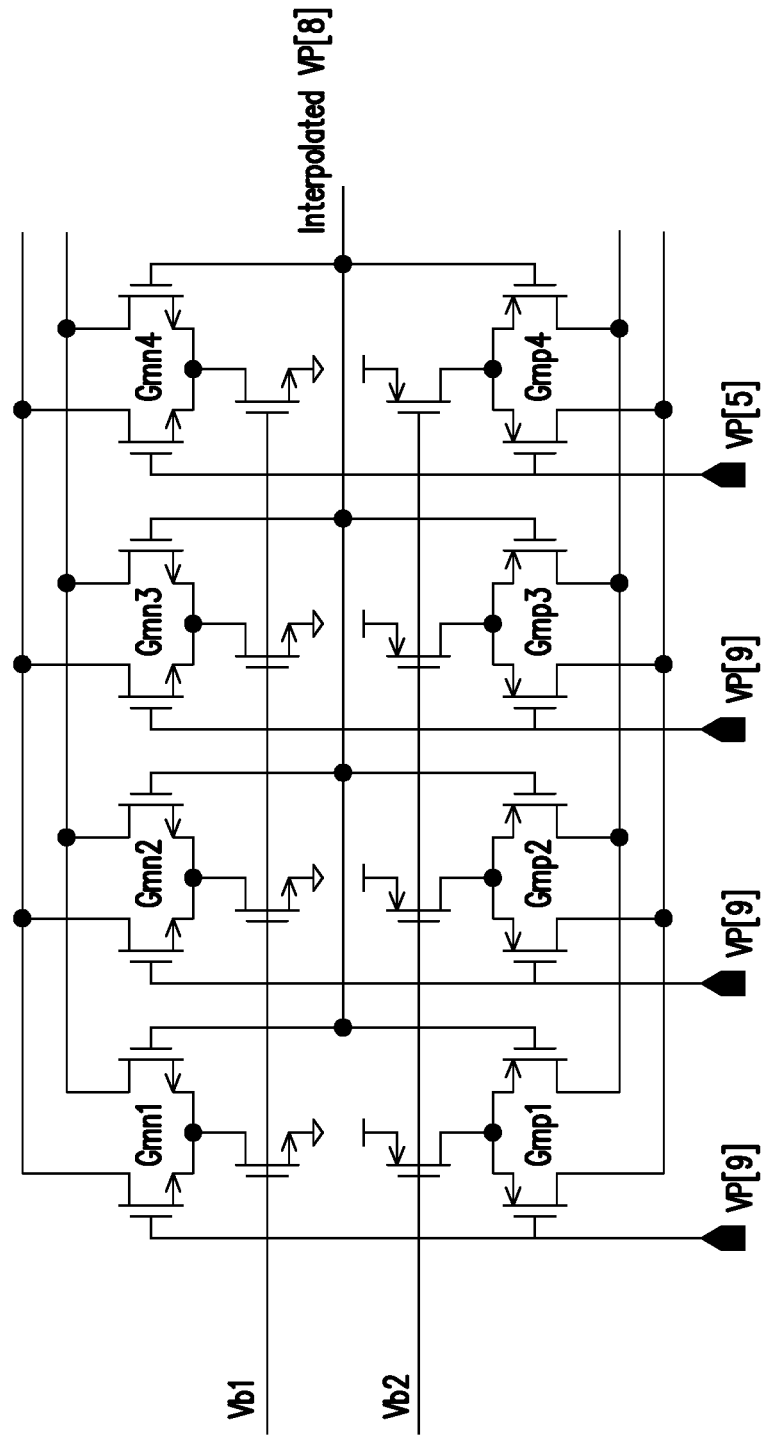
FIG. 4B illustrates a schematic diagram of an operational amplifier during an interpolation operation according to an embodiment of the present disclosure.

FIG. 4B shows a DDA 420 during an interpolation operation according to an embodiment of the present disclosure. The interpolated voltage VP[8] may be obtained by providing the input voltage VP[9] to three out of four input terminals of the DDA 420 and providing the input voltage VP [5] to the final input terminal of the DDA 420. In FIG. 4B, the N-type differential transistor pairs and the P-type differential transistor pairs of the DDA 420 is biased by the bias voltages Vb1 and Vb2 respectively. Accordingly, the Gm values of N-type differential transistor pairs are Gmn1 to Gmn4 and Gm values of P-type differential transistor pairs are Gmp1 to Gmp4.

Since the bias voltages Vb1 and Vb2 are provided by a constant Gm bias circuit, the Gm values Gmn1 to Gmn4 and Gmp1 to Gmp4 remain substantially constant despite of the temperature and voltage changes (e.g., PVT effect). As such, errors on the interpolated voltage VP[8] are prevented. In analogy, the other interpolated voltages VP[2] to VP[4] and VP[6] to VP[7] may be obtained by perform interpolating operations on the predetermined input voltage VP[1], VP[5] and VP [9].

Figure 5:
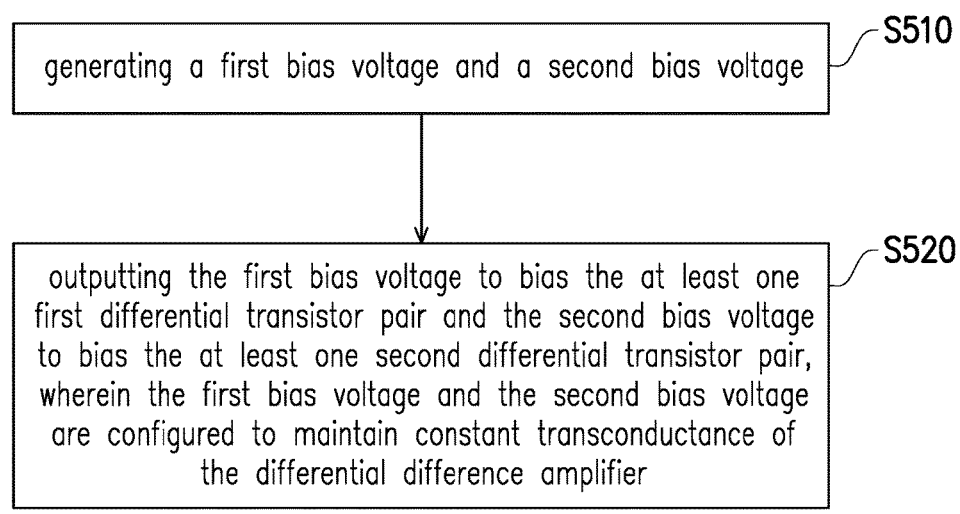
FIG. 5 illustrates a method of biasing a differential difference amplifier of an operational amplifier according to an embodiment of the disclosure.

FIG. 5 illustrates a method of biasing a DDA of an OP according to an embodiment of the disclosure. In steps S510, a first bias voltage and a second bias voltage are generated. In steps S520, the generated first bias voltage is outputted to bias the at least one first differential transistor pair and the generated second bias voltage is outputted to bias the at least one second differential transistor pair. The first bias voltage and the second bias voltage are configured to maintain constant Gin of the differential difference amplifier.

From the above embodiments, a constant Gm bias circuit is used to generate bias voltages to bias differential transistor pairs of an OP in such a way that the Gm values of the differential transistor pairs remain substantially constant. Since the Gin values remain substantially constant with variations of temperature and voltages, interpolated voltages obtained by interpolation operations on the OP is more accurate and performance of the OP is improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. An operational amplifier, comprising:
   a differential difference amplifier, having at least one first differential transistor pair and at least one second differential transistor pair; and
   a constant transconductance bias circuit, electrically connected to the differential difference amplifier, outputting a first bias voltage to bias the at least one first differential transistor pair and outputting a second bias voltage to bias the at least one second differential transistor pair,
   wherein the first bias voltage and the second bias voltage are configured to maintain constant Gm of the differential difference amplifier,
   wherein the differential difference amplifier comprises:
      at least one first bias transistor, coupled to the at least one first differential transistor pair, wherein a control terminal of the at least one first bias transistor receives the first bias voltage to bias the at least one first differential transistor pair; and
      at least one second bias transistor, coupled to the at least one second differential transistor pair, wherein a control terminal of the at least one second bias transistor receives the second bias voltage to bias the at least one second differential transistor pair.

2. The operation amplifier of claim 1, the at least one first differential transistor pair has a first conductivity type, the at least one second differential transistor pair has a second conductivity type, and the first conductivity type is different from the second conductivity type.

3. The operational amplifier of claim 1, wherein the differential difference amplifier further comprises:
   at least one input terminal, each of the at least one input terminal is coupled to a transistor of the at least one first differential transistor pair and a transistor of the at least one second differential transistor pair,
   an output terminal, coupled to the other transistor of the at least one first differential transistor pair and the other transistor of the at least one second differential transistor pair.

4. The operational amplifier of claim 3, wherein
   the at least one input terminal of the differential difference amplifier is configured to receive at least one input signal, and
   the output terminal of the differential difference amplifier is configured to output an interpolation signal of at least one input signal.

5. The operation amplifier of claim 4, wherein
   the at least one input signal comprises a plurality of predetermined input voltage signals, and
   the at least one input terminal comprises a first terminal, a second terminal, a third terminal and a fourth terminal, wherein at least two of the first terminal, second terminal and the third terminal receive the same input voltage signal among the predetermined input voltage signal.

6. The operational amplifier of claim 3, wherein
   the interpolation signal is obtained according to Gm values of the at least one first differential transistor pair, Gm values of the at least one second differential transistor pair, and the at least one input signal.

7. The operational amplifier of claim 1, wherein the constant Gm bias circuit comprises:
   a first constant Gm bias circuit, generating the first bias voltage to bias the at least one first differential transistor pair; and
   a second constant Gm bias circuit, generating the second bias voltage to bias the at least one second differential transistor pair.

8. The operational amplifier of claim 7, wherein each of the first constant Gm bias circuit and the second constant transconductance bias circuit comprises:
   a first transistor pair;
   a second transistor pair, coupled to the first transistor pair through a first node and a second node; and
   a transconductance setting transistor, coupled to the first transistor pair,
   wherein transconductance values of the at least one first differential transistor pair are inversely proportional to a resistance value of the transconductance setting transistor, and
   transconductance values of the at least one second differential transistor pair are inversely proportional to a resistance value of the Gm setting transistor.

9. The operational amplifier of claim 8, wherein the first transistor pair has a first conductivity type, the second transistor pair has a second conductivity type.

10. The operational amplifier of claim 8, wherein
    the first node is coupled to control terminals of the second transistor pair,
    the second node is coupled to control terminals of the first transistor pair, and
    the first node provides the first bias voltage or the second bias voltage to the differential difference amplifier.

11. The operational amplifier of claim 7, wherein
the at least one first differential transistor pair comprises a first transistor pair group and a second transistor pair group,
the at least one second differential transistor pair comprises a third transistor pair group and a fourth transistor pair group,
the first transistor pair is biased by the first bias voltage,
the second transistor pair is biased by a third bias voltage,
the third transistor pair is biased by the second bias voltage, and
the fourth transistor pair is biased by a fourth bias voltage.

12. The operational amplifier of claim 11, wherein the constant Gm bias circuit further comprises:
a third constant Gm bias circuit, generating the third bias voltage; and
a fourth constant Gm bias circuit, generating the fourth bias voltage.

13. A method for biasing a differential difference amplifier having at least one first differential transistor pair, at least one second differential transistor pair, at least one first bias transistor and at least one second bias transistor, the method comprising:
generating a first bias voltage and a second bias voltage; and
outputting the first bias voltage to bias the at least one first differential transistor pair and the second bias voltage to bias the at least one second differential transistor pair;
wherein the first bias voltage and the second bias voltage are configured to maintain constant transconductance of the differential difference amplifier,
wherein the at least one first bias transistor is coupled to the at least one first differential transistor pair, a control terminal of the at least one first bias transistor receives the first bias voltage to bias the at least one first differential transistor pair, the at least one second bias transistor is coupled to the at least one second differential transistor pair, and a control terminal of the at least one second bias transistor receives the second bias voltage to bias the at least one second differential transistor pair.

14. The method of claim 13, further comprising:
providing at least one input signal to at least one input terminal of the differential difference amplifier;
performing an interpolation operation on the at least one input signal to output an interpolation signal.

15. The method of claim 14, wherein the interpolation signal is obtained according to transconductance values of the at least one first differential transistor pair, transconductance values of the at least one second differential transistor pair, and the at least one input signal.

16. The method of claim 15, wherein the at least one input signal comprises a plurality of predetermined input voltage signals.

17. The method of claim 13, wherein
the at least one first differential transistor pair comprises a first transistor pair group and a second transistor pair group,
the at least one second differential transistor pair comprises a third transistor pair group and a fourth transistor pair group,
wherein the first transistor pair group is biased by the first bias voltage, the second transistor pair group is biased by a third bias voltage, the third transistor pair group is biased by the second bias voltage, and the fourth transistor pair group is biased by a fourth bias voltage.

18. The method of claim 13, wherein the at least one first differential transistor pair has a first conductivity type, the at least one second differential transistor pair has a second conductivity type, and the first conductivity type is different from the second conductivity type.

* * * * *